(12) United States Patent
Yu et al.

(10) Patent No.: US 8,692,378 B2
(45) Date of Patent: Apr. 8, 2014

(54) UBM STRUCTURES FOR WAFER LEVEL CHIP SCALE PACKAGING

(75) Inventors: Tsung-Yuan Yu, Taipei (TW);
Hsien-Wei Chen, Hsin-Chu (TW);
Ying-Ju Chen, Tuku Township (TW);
Shih-Wei Liang, Dajia Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 37 days.

(21) Appl. No.: 13/312,538

(22) Filed: Dec. 6, 2011

(65) Prior Publication Data

US 2013/0140706 A1    Jun. 6, 2013

(51) Int. Cl.
*H01L 23/34*    (2006.01)

(52) U.S. Cl.
USPC .......................................... 257/773

(58) Field of Classification Search
USPC ................. 257/773–774, 750, 758, 778, 676, 257/737–738, 780
See application file for complete search history.

(56) References Cited

U.S. PATENT DOCUMENTS

| 6,782,897 B2 * | 8/2004 | Wang et al. ................... 134/1.2 |
| 8,294,279 B2 * | 10/2012 | Chen et al. .................. 257/777 |
| 8,487,438 B2 * | 7/2013 | Lin et al. ..................... 257/751 |

* cited by examiner

*Primary Examiner* — Hoa B Trinh
(74) *Attorney, Agent, or Firm* — Slater & Matsil, L.L.P.

(57) ABSTRACT

A wafer level chip scale semiconductor device comprises a semiconductor die, a first under bump metal structure and a second under bump metal structure. The first under bump metal structure having a first enclosure is formed on a corner region or an edge region of the semiconductor die. A second under bump metal structure having a second enclosure is formed on an inner region of the semiconductor die. The first enclosure is greater than the second enclosure.

11 Claims, 6 Drawing Sheets

UBM STRUCTURES FOR WAFER LEVEL CHIP SCALE PACKAGING

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, chip-scale or chip-size packaging based semiconductor devices have emerged as an effective alternative to further reduce the physical size of a semiconductor chip. In a chip-scale packaging based semiconductor device, the packaging is generated on the die with contacts provided by a variety of bumps. Much higher density can be achieved by employing chip-scale packaging based semiconductor devices. Furthermore, chip-scale packaging based semiconductor devices can achieve smaller form factors, cost-effectiveness, increased performance and lower power consumption.

A chip-scale packaging based semiconductor device may comprise a plurality of solder balls formed on a plurality of under bump metal (UBM) openings of a semiconductor die. Due to the mismatch between different materials in a chip-scale package, greater stress may be generated on the corners or the edges of the chip-scale package. As a result, the corners or the edges of the chip-scale package are prone to failures. Possible failures comprise extreme low k (ELK) material layer cracks, solder bump cracks and the like. The stress can be reduced by using an adequate enclosure underneath the under bump metal structures.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a under bump metal (UBM) structure design technique for a wafer level chip scale package. The invention may also be applied, however, to a variety of packages of the semiconductor industry.

Figure 1:
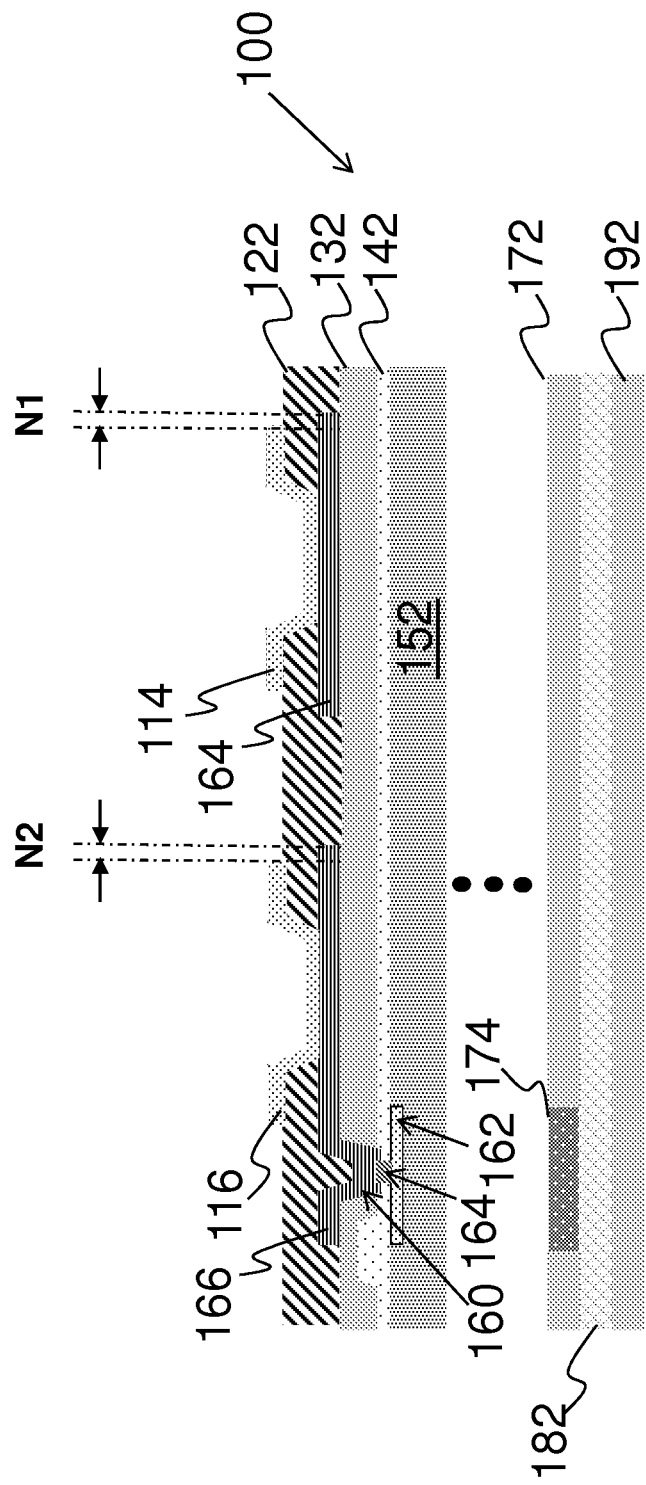
FIG. 1 illustrates a cross sectional view of a wafer level chip scale package in accordance with an embodiment.

Referring initially to FIG. 1, a cross sectional view of a wafer level chip scale package is illustrated in accordance with an embodiment. As shown in FIG. 1, the wafer level chip scale package is formed on a semiconductor die 100. The semiconductor die 100 comprises a substrate 192. The substrate 192 may be a silicon substrate. Alternatively, the substrate 192 may be a silicon-on-insulator substrate. The substrate 192 may further comprise a variety of electrical circuits (not shown). The electrical circuits formed on the substrate 192 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present invention and are not meant to limit the present invention in any manner.

An interlayer dielectric layer 182 is formed on top of the substrate 192. The interlayer dielectric layer 182 may be formed, for example, of a low-K dielectric material, such as silicon oxide. The interlayer dielectric layer 182 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 182 may further comprise a plurality of dielectric layers.

A bottom metallization layer 172 and a top metallization layer 152 are formed over the interlayer dielectric layer 182. As shown in FIG. 1, the bottom metallization layer 172 comprises a first metal line 174. Likewise, the top metallization layer 152 comprises a second metal line 162. Metal lines 174 and 162 are formed of metal materials such as copper or copper alloys and the like. It should be noted while FIG. 1 shows the bottom metallization layer 172 and the top metallization layer 152, one skilled in the art will recognize that one or more inter-metal dielectric layers (not shown) and the associated metallization layers (not shown) are formed between the bottom metallization layer 172 and the top metallization layer 152. Generally, the one or more inter-metal dielectric layers and the associated metallization layers are used to interconnect the electrical circuits in the substrate 192 to each other and to provide an external electrical connection.

A passivation layer 142 is formed on top of the top metallization layer 152. In accordance with an embodiment, the passivation layer 142 is formed of non-organic materials such as un-doped silicate glass, silicon nitride, silicon oxide and the like. An aluminum pad 160 may be formed on top of the passivation layer 142. Furthermore, the aluminum pad 160 may be connected to the top metal line 162 through a via hole 164. In accordance with an embodiment, the via hole 164 is fully filled with metallic materials such as copper, copper alloys, aluminum, silver, gold and any combinations thereof. The via hole 164 may be formed by suitable techniques such as CVD. Alternatively, the via hole 164 may formed by sputtering, electroplating and the like.

A first polymer layer 132 is formed on top of the passivation layer 142. The first polymer layer 132 is made of polymer materials such as epoxy, polyimide and the like. The first polymer layer 132 may be made by any suitable method known in the art such as spin coating. A redistribution layer 166 is formed on the first polymer layer 132. As shown in FIG. 1, the redistribution layer 166 connects the aluminum pad 160 with the top surface of the semiconductor die 100. More particularly, the redistribution layer 166 provides a conductive path between the metal lines (e.g., metal line 162) and the top surface of the semiconductor die 100 (e.g., UBM 116).

A second polymer layer 122 is formed on top of the first polymer layer 132. As shown in FIG. 1, both the redistribution layer 166 and the redistribution layer 164 are embedded in the second polymer layer 122. The second polymer layer 122 is patterned to form a plurality of openings. Furthermore, various under bump metal (UBM) structures (e.g., UBM 116) are formed on top of the openings. The UBM structures (e.g., UBM 116) are employed to connect the redistribution layers (e.g., redistribution layer 166) with various input and output terminals (e.g., bumps 106 and 104). Each UBM structure may further comprise a variety of sub-layers such as a seed layer (not shown), an adhesion layer (not shown) and/or the like. The UBM structures may be formed by any suitable techniques such as evaporation, electroplating and the like.

In order to reduce the stresses on the UBM structures, the diameter of the RDL pad (e.g., RDL 164) is larger than the diameter of the corresponding UBM structure (e.g., UBM structure 114). As shown in FIG. 1, there may be a first gap N1 between the outer edge of the RDL pad and the outer edge of the UBM structure. In accordance with an embodiment, N1 is equal to 5 um. Likewise, there may be a second gap N2 between the outer edge of the RDL pad 166 and the outer edge of the UBM structure. In accordance with an embodiment, N2 is less than 5 um. The detailed description of how to determine N1 and N2, with a particular attention to set up different gaps between the RDL and the corresponding UBM structure based upon different locations will be discussed below with respect to FIGS. 2-6.

Figure 2:
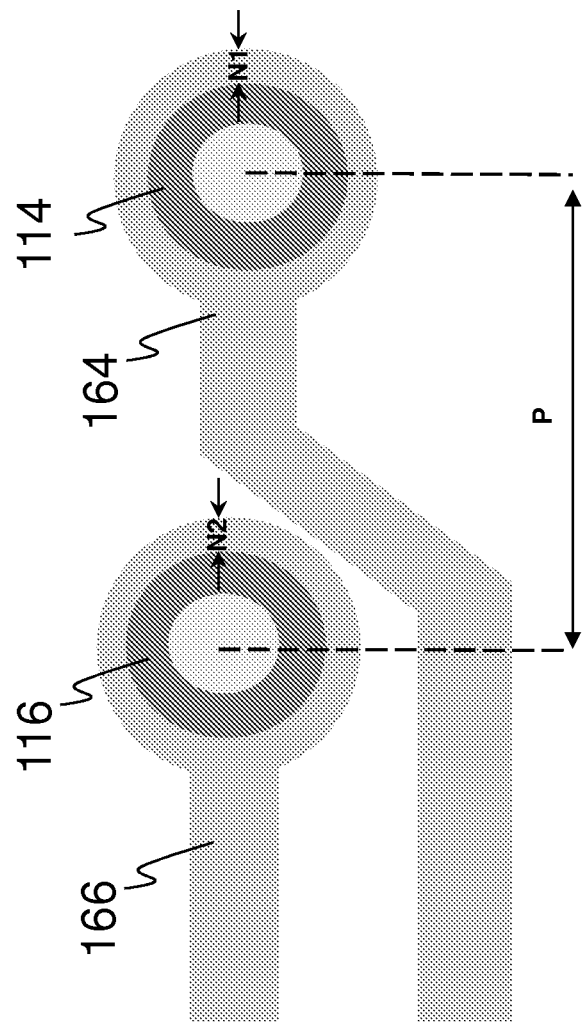
FIG. 2 illustrates a top view of two under bump metal (UBM) structures formed on two redistribution layers (RDL) pads respectively.

FIG. 2 illustrates a top view of two UBM structures formed on two RDL pads respectively. On a semiconductor die, there may be a plurality of UBM structures. Two UBM structures are selected to illustrate the inventive aspects of various embodiments. In accordance with an embodiment, a first UBM structure 114 is adjacent to a corner of the semiconductor. In contrast, a second UBM structure 116 is located immediately next to the first UBM structure 114, but not immediately next to the corner or the edge of the semiconductor die. The pitch between the first UBM structure 114 and the second UBM structure 116 is the distance between the centers of two UBM structures. In accordance with an embodiment, the pitch P is in a range between about 100 um and about 400 um.

As shown in FIG. 2, both the first UBM structure 114 and the second UBM structure 116 have a circular shape. In addition, in order to reduce the stresses on the UBM structures, two RDL pads are formed underneath the first UBM structure 114 and the second UBM structure 116 respectively. Furthermore, both the first RDL pad and the second RDL pad have a diameter larger than their corresponding UBM structure's diameter. N1 is the minimum distance between the outer edge of the first UMB structure and the outer edge of the first RDL pad. Likewise, N2 is the minimum distance between the outer edge of the second UMB structure and the outer edge of the second RDL pad. In accordance with an embodiment, N1 is equal to or greater than 5 um. N2 is equal to or greater than 2 um.

Figure 3:
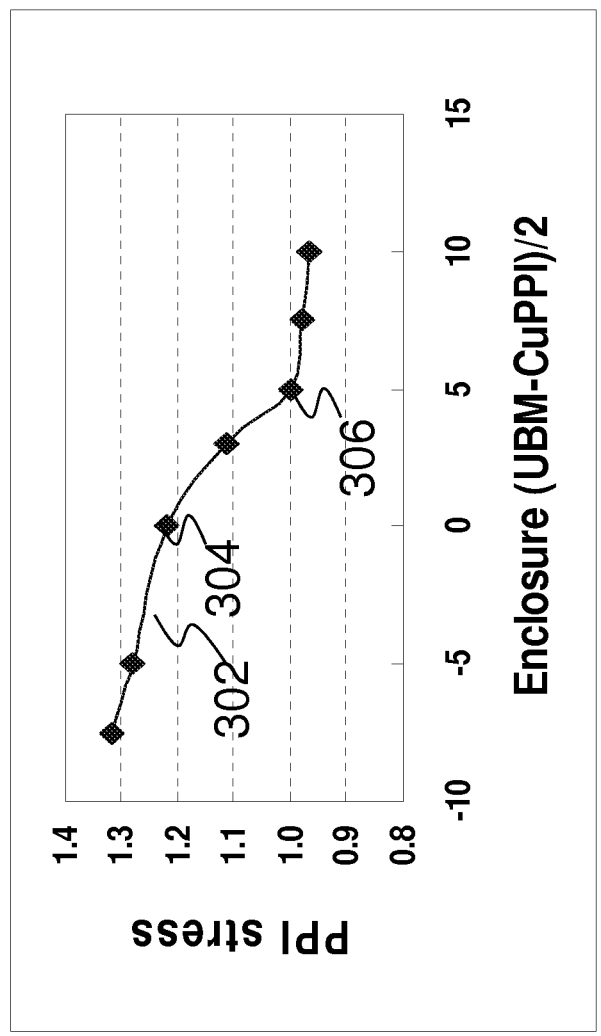
FIG. 3 illustrates the stress on the RDL pad versus the enclosure size of the UBM structure.

FIG. 3 illustrates the stress on the RDL pad versus the enclosure size of the UBM structure. The horizontal axis of FIG. 3 represents the enclosure size of the UBM structure. In accordance with an embodiment, the enclosure size is defined as one half of the difference between the diameter of the RDL pad and the diameter of the UBM structure. The vertical axis of FIG. 3 represents the stress on the RDL pad. A curve 302 illustrates the stress on the RDL pad when different enclosures are employed.

As shown in FIG. 3, when the enclosure size is more than 5 um, the stresses under different enclosures are quite similar to the stress at a point 306, wherein a 5 um enclosure is employed. However, once the enclosure size is less than 5 um, the stress on the RDL pad is in reverse proportion to the enclosure size. For example, when the enclosure size is 0 um, the corresponding stress on the RDL pad increases by 20% in comparison with the stress on the RDL pad when the enclosure size is about 5 um.

FIG. 3 shows the stress on a RDL pad with different enclosure sizes. An increase of the enclosure size leads to a decrease of the stress on the RDL pad. As such, UBM structures having a larger enclosure may be applicable to some stress prone regions such as the corners or edges of the semiconductor die. In contrast, a smaller enclosure may be employed at other regions such as the inner region of the semiconductor die. The details of how to configure UBM structures having different enclosures will be described below with respect FIGS. 4-6. An advantageous feature of this embodiment is that semiconductor devices having a combination of larger enclosures and smaller enclosures may reduce the possibility of having cracks in the semiconductor device and improve the routing flexibility.

Figure 4:
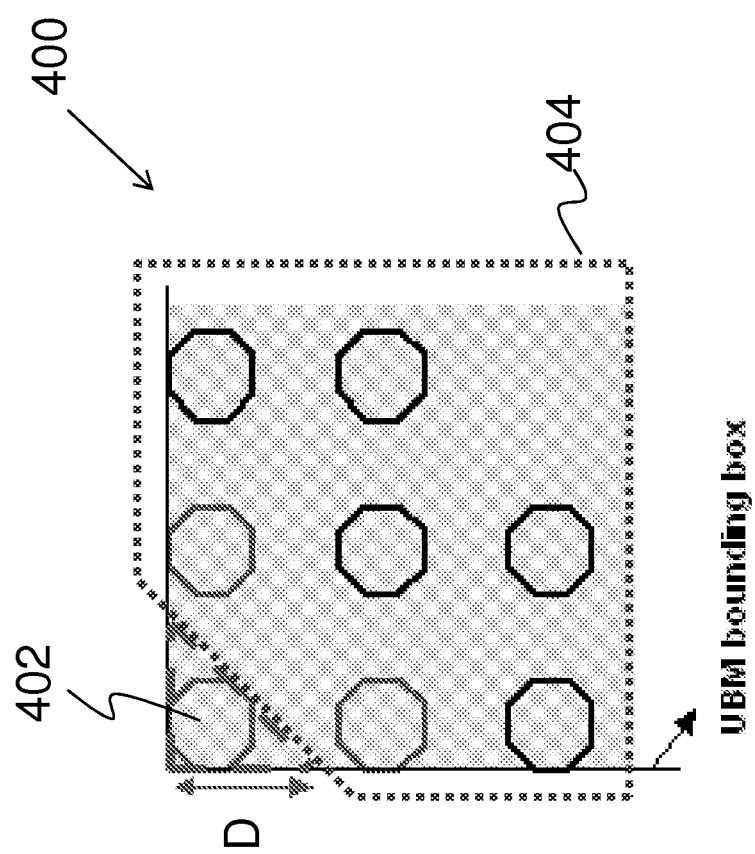
FIG. 4 illustrates a top view of a semiconductor die having different enclosures for under bump metal structures in accordance with an embodiment.

FIG. 4 illustrates a top view of a semiconductor die having different enclosures for UBM structures in accordance with an embodiment. In order to reduce the stress on the stress prone areas such as four corners of the semiconductor die, a larger enclosure is employed at each corner of the semiconductor die. There may be an array of UBM structures on the semiconductor die. For simplicity, only the top left portion of the semiconductor die is shown in the top view. As shown in FIG. 4, the UBM structure 402 is located at the top left corner of the semiconductor die. As shown in FIG. 4, the top left corner is a right triangle having a side length D equal to the pitch between two adjacent UBM structures. In accordance with an embodiment, the enclosure of the UBM structure 402 is greater than or equal to 5 um. In contrast, the other UBM structures in the UBM bounding box 404 have an enclosure of about 2 um. The larger enclosure at the top left corner of the semiconductor die 400 helps to reduce the stress at the RDL pad (not shown) underneath the UBM structure 402 so as to reduce the possibility of cracks in the semiconductor die 400.

Figure 5:
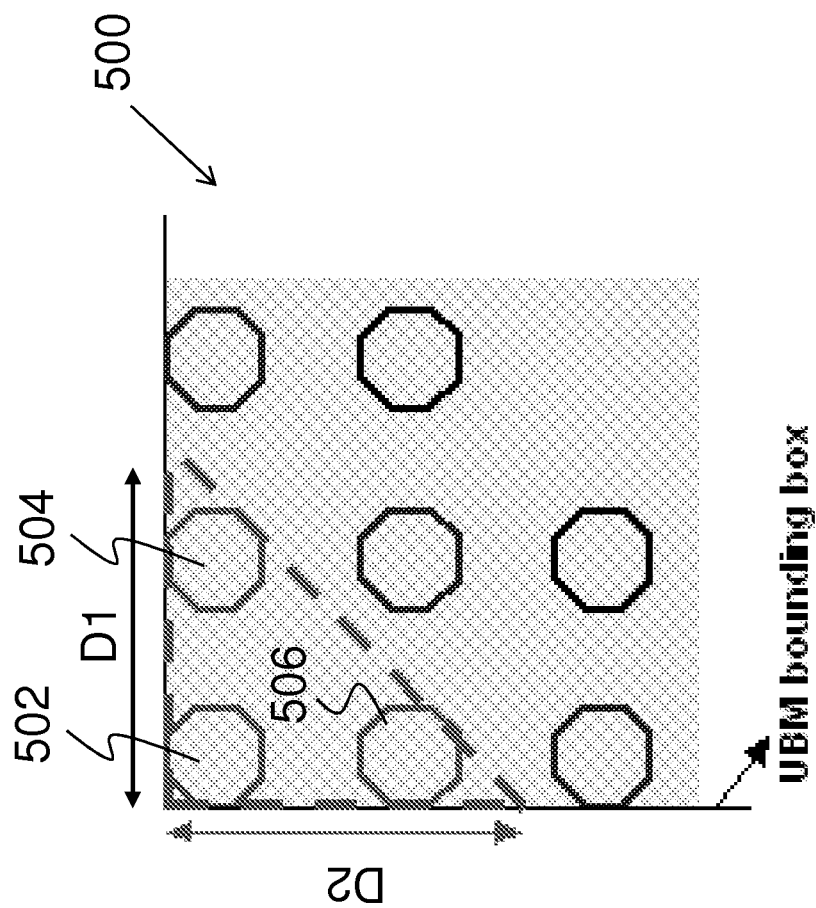
FIG. 5 illustrates a top view a semiconductor die having different enclosures for under bump metal structures in accordance with another embodiment.

FIG. 5 illustrates a top view a semiconductor die having different enclosures for UBM structures in accordance with another embodiment. The structure of the semiconductor die 500 shown in FIG. 5 is similar to the semiconductor die 400 shown in FIG. 4 except that the allocation of the UBM structures having a larger enclosure is slightly different from that of the semiconductor die 400. As shown in the top view, the UBM structures (e.g., UBM 502) having a larger enclosure are employed in a triangle corner region. As shown in FIG. 5, the triangle corner region is a right triangle. In accordance with an embodiment, the first side D1 and the second side D2 is approximately equal to ⅒ of the horizontal length and vertical length of the semiconductor die respectively when the semiconductor die 500 is smaller than or equal to 5 mm by 5 mm. In contrast, the first side D1 and the second side D2 is approximately equal to 1/15 of the horizontal length and vertical length of the semiconductor die respectively when the size of the semiconductor die 500 is between a 5 mm by 5 mm package and a 10 mm by 10 mm package.

In accordance with an embodiment, the triangle corner region may include a first UBM structure 502, a second UBM structure 504 and a third UBM structure 506. The enclosure of each UBM structure in the triangle corner region is greater than or equal to 5 um. Alternatively, the enclosure of each UBM structure in the triangle corner region may be further reduced when the semiconductor die 500 is relatively small. In particular, when the semiconductor die is smaller than or equal to 3 mm by 3 mm, the enclosure of each UBM structure (e.g., UBM 502) in the triangle corner region is greater than or equal to 3 um. Otherwise, the enclosure of each UBM structure in the triangle corner region is greater than or equal to 5 um.

Figure 6:
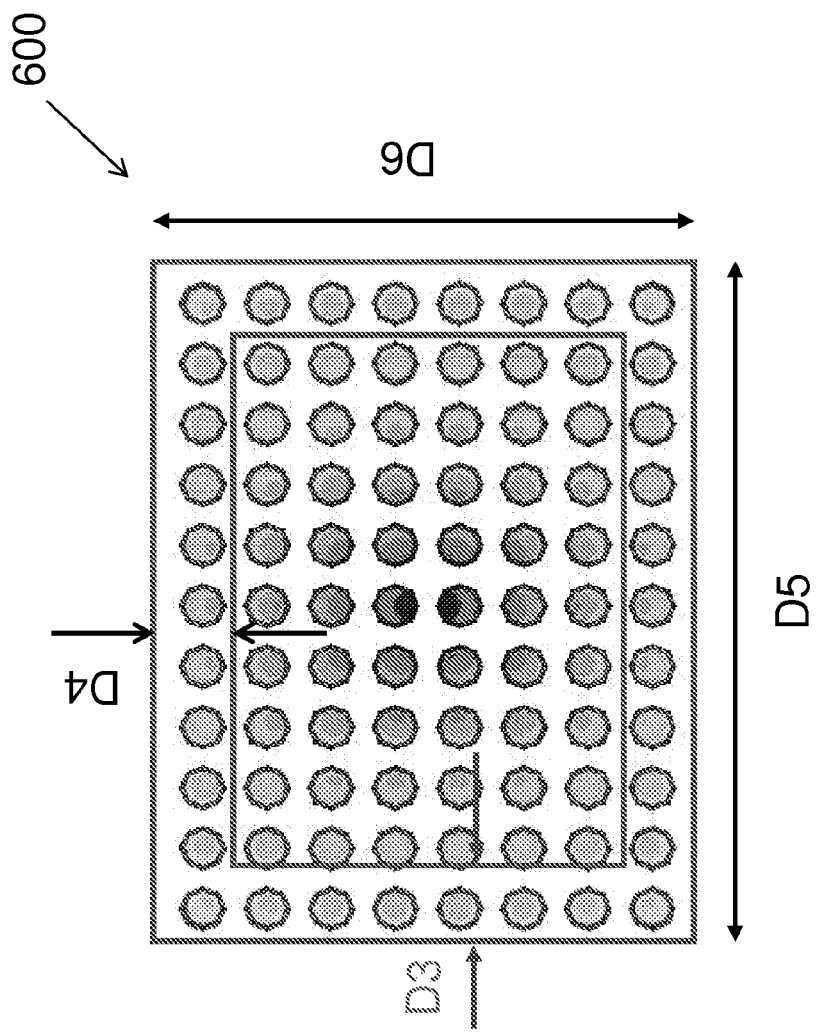
FIG. 6 illustrates a top view a semiconductor die having different enclosures for under bump metal structures in accordance with yet another embodiment.

FIG. 6 illustrates a top view a semiconductor die having different enclosures for UBM structures in accordance with yet another embodiment. As shown in FIG. 6, the UBM structures having a larger enclosure are employed on an outer region of the semiconductor die 600. In contrast, the UBM structures having a smaller enclosure are employed on the inner region of the semiconductor die 600. There may be a variety of ways to define the border between an inner region and an outer region. In accordance with an embodiment, an outer region comprises four edge regions. Each edge region has a width (e.g., $D_3$ and $D_4$) approximately equal to or less than 10% of the corresponding length (e.g., $D_5$ and $D_6$) of the semiconductor die 600. By employing different enclosures on the top surface of the semiconductor die 600, the stress on the RDL pads located in the outer region may be reduced. As a result, the cracks derived from the stress may be reduced.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
a semiconductor die;
a first under bump metal structure having a first enclosure on a first region of the semiconductor die, wherein the first under bump metal structure is configured to connect a first redistribution layer with a first bump, and wherein an edge of the first redistribution layer extends beyond an edge of the first under bump metal structure, and wherein the first enclosure is a gap between the edge of the first redistribution layer and the edge of the first under bump metal structure; and
a second under bump metal structure having a second enclosure on a second region of the semiconductor die, wherein the second under bump metal structure is configured to connect a second redistribution layer with a second bump, and wherein an edge of the second redistribution layer extends beyond an edge of the second under bump metal structure, and wherein the second enclosure is a gap between the edge of the second redistribution layer and the edge of the second under bump metal structure, and wherein the first region is away from an edge of the semiconductor die and the second region is adjacent to the edge of the semiconductor die, and wherein the second enclosure is greater than the first enclosure.

2. The device of claim 1, wherein:
the first region is an inner region of the semiconductor die; and
the second region is an outer region of the semiconductor die.

3. The device of claim 2, wherein the outer region has a width approximately equal to or less than one eighth of a width of the inner region.

4. The device of claim 3, wherein:
the second region is a corner portion of the semiconductor die.

5. The device of claim 4, wherein the corner portion of the semiconductor die is a right triangle comprising:
a first side approximately equal to or less than one tenth of a first length of the semiconductor die; and
a second side approximately equal to or less than one tenth of a second length of the semiconductor die.

6. The device of claim 1, wherein:
the first region is an inner region of the semiconductor die; and
the second region comprises a first under bump metal structure adjacent to a corner of the semiconductor die.

7. An apparatus comprising:
a semiconductor die;
a first under bump metal structure having a first enclosure adjacent to a corner portion of the semiconductor die, wherein the first under bump metal structure is configured to connect a first redistribution layer with a first bump, wherein an edge of the first redistribution layer extends beyond an edge of the first under bump metal structure, and wherein the first enclosure is a gap between the edge of the first redistribution layer and the edge of the first under bump metal structure; and
a second under bump metal structure having a second enclosure formed not adjacent to the corner portion of the semiconductor die, wherein the second under bump metal structure is configured to connect a second redistribution layer with a second bump, and wherein an edge of the second redistribution layer extends beyond an edge of the second under bump metal structure, and wherein the second enclosure is a gap between the edge of the second redistribution layer and the edge of the second under bump metal structure, and wherein the first enclosure is greater than the second enclosure.

8. The apparatus of claim 7, wherein the corner portion of the semiconductor die has a right triangle shape comprising:

a first side approximately equal to or less than one tenth of a horizontal length of the semiconductor die; and a second side approximately equal to or less than one tenth of a vertical length of the semiconductor die.

9. The apparatus of claim 7, wherein:

the first enclosure is formed by the first redistribution layer underneath the first under bump metal structure; and the second enclosure is formed by the second redistribution layer underneath the second under bump metal structure.

10. The apparatus of claim 7, wherein:

the first enclosure is greater than or equal to 5 um; and the second enclosure is greater than or equal to 2 um.

11. The apparatus of claim 7, wherein the semiconductor die comprises:

a substrate;

an interlayer dielectric layer formed on the substrate;

a plurality of metallization layers formed over the interlayer dielectric layer;

a passivation layer formed over the plurality of metallization layers;

a first polymer layer formed on the passivation layer; and a second polymer layer formed on the first polymer layer, wherein a redistribution layer is formed in the second polymer layer.

* * * * *